US010700038B2

United States Patent
McClain et al.

(10) Patent No.: US 10,700,038 B2
(45) Date of Patent: Jun. 30, 2020

(54) METHODS AND SYSTEMS FOR INHIBITING BONDING MATERIALS FROM CONTAMINATING A SEMICONDUCTOR PROCESSING TOOL

(71) Applicant: Micron Technology, Inc., Boise, ID (US)

(72) Inventors: Benjamin L. McClain, Boise, ID (US); Jeremy E. Minnich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 130 days.

(21) Appl. No.: 15/686,963

(22) Filed: Aug. 25, 2017

(65) Prior Publication Data
US 2019/0067238 A1    Feb. 28, 2019

(51) Int. Cl.
*H01L 21/67* (2006.01)
*H01L 23/00* (2006.01)

(52) U.S. Cl.
CPC ........ *H01L 24/75* (2013.01); *H01L 21/67144* (2013.01); *H01L 24/29* (2013.01); *H01L 24/83* (2013.01); *H01L 2224/29101* (2013.01); *H01L 2224/7501* (2013.01); *H01L 2224/7565* (2013.01); *H01L 2224/75102* (2013.01); *H01L 2224/75305* (2013.01); *H01L 2224/75745* (2013.01); *H01L 2224/8309* (2013.01); *H01L 2224/83191* (2013.01); *H01L 2224/83801* (2013.01)

(58) Field of Classification Search
None
See application file for complete search history.

(56) References Cited

FOREIGN PATENT DOCUMENTS

| JP | 06-314708 A | * 11/1994 |
| JP | 07-161742 A | * 6/1995 |
| WO | WO-2012/165313 A | * 12/2012 |
| WO | WO-2018/092306 A1 | * 5/2018 |

OTHER PUBLICATIONS

Machine Translation of PCT WO 2012/165313, Date Unknown.*
Machine Translation of Japanese Patent 07-161742, Date Unknown.*
Machine Translation of PCT WO 2018/092306, Date Unknown.*
Machine Translation of Japanese Patent 2-06-314708, Date Unknown.*

* cited by examiner

*Primary Examiner* — Jeffry H Aftergut
(74) *Attorney, Agent, or Firm* — Perkins Coie LLP (57) ABSTRACT

Methods and systems for inhibiting bonding materials from entering a vacuum system of a semiconductor processing tool are disclosed herein. A semiconductor processing tool configured in accordance with a particular embodiment includes a bondhead having a first port, a second port, a first channel fluidly coupled to the first port, and a second channel fluidly coupled to the second port. The first port and first channel together comprise a first opening extending through the bondhead, and the second port and second channel together comprise a second opening extending through the bondhead. The second opening at least partially surrounds the first opening. A first flow unit is coupled to the first port and is configured to withdraw air from the first opening. A second flow unit is coupled to the second port and is configured to provide fluid to or withdraw fluid from the second opening.

25 Claims, 8 Drawing Sheets

*FIG. 7B*

METHODS AND SYSTEMS FOR INHIBITING BONDING MATERIALS FROM CONTAMINATING A SEMICONDUCTOR PROCESSING TOOL

TECHNICAL FIELD

The present technology is related to bondheads used during the bonding process of semiconductor dies. In particular, some embodiments of the present technology are related to systems and methods for mitigating bonding material from contaminating semiconductor processing tools.

BACKGROUND

Figure 1:
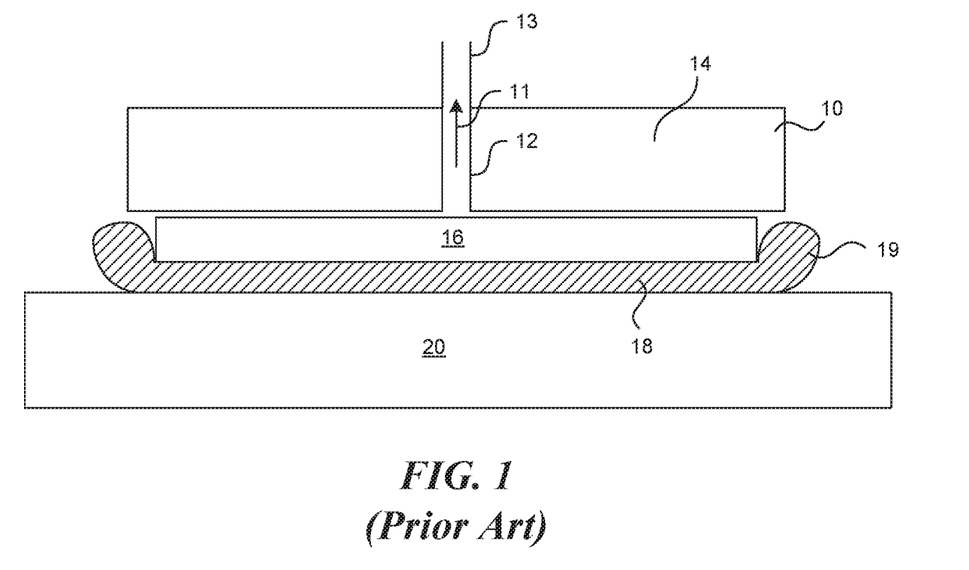
FIG. 1 is a cross-sectional side view of a conventional bondhead in accordance with the prior art.

Semiconductor devices, such as memory chips and microprocessor chips, typically include a semiconductor device bonded to a substrate with a bonding material. During the conventional bonding process, a chip mounting apparatus picks up a semiconductor device by drawing a vacuum through the bondhead, and transfers the semiconductor device to a bonding area where the semiconductor device is bonded to a substrate. As shown in FIG. 1, a semiconductor device 16 is brought into contact with a bondhead 10 by a vacuum 11 and is attached to a substrate 20 with a bonding material 18 onto the device 16. A vacuum line 13 attached to a channel 12 of the bondhead 10 draws the vacuum 11 that is maintained until the device 16 is securely placed into a bonding position. The bonding process described herein is typically performed at high temperatures to ensure the bonding material 18 has an appropriate viscosity, interconnects are formed, and some of the bonding material 18 tends to vaporize at the higher temperatures.

A drawback of the conventional bonding process described above is the potential for vaporized bonding material 18 to enter and condense in the vacuum line 13. More specifically, gaps often exist between the bondhead 10 and the device 16 because topography of each semiconductor device 16 has small imperfections and warpage. As a result, there is rarely a perfect seal between the bondhead 10 and the semiconductor device 16 such that some of the vaporized bonding material 18 is drawn through the gaps and enters the vacuum line 13. The vaporized bonding material 18 cools as it travels through the vacuum line 13 and condenses onto the vacuum lines 13 and/or hardware that is drawing the vacuum 11 itself. The condensed bonding material 18 can clog the vacuum lines 13 and decrease the strength of the vacuum 11, thereby causing the vacuum 11 and vacuum lines 13 to be less reliable in picking up and transferring semiconductor devices. Eventually, the vacuum lines and/or hardware may need to be replaced or cleaned, resulting in unnecessary expenses and manufacturing downtime.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of methods for making semiconductor devices are described herein along with related devices and systems. The term "semiconductor device" generally refers to a solid-state device that includes semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. The term "support substrate" can refer to printed circuit boards (PCBs) or other suitable substrates that carry the assembly of semiconductor devices and provide electrical connections to the semiconductor device assembly. The term "bondhead" can refer to an upper/lower chuck or a tool for use in mounting semiconductor devices to substrates. A person skilled in the relevant art will also understand that the technology may have additional embodiments and that the technology may be practiced without several of the details of the embodiments described below with reference to FIGS. 2A-7B. A person having ordinary skill in the relevant art will recognize that suitable steps of the methods described herein can be performed at the wafer-level or at the die-level. Furthermore, unless the context indicates otherwise, structures disclosed herein can be formed using conventional semiconductor-manufacturing techniques.

For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading may be used to indicate materials in a cross section that can be compositionally similar, but the use of the same shading does not imply that the materials should be construed to be identical.

Figure 2A:
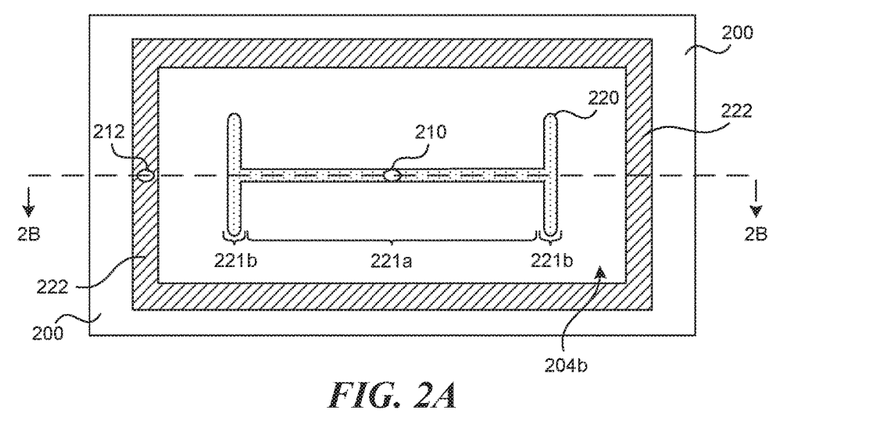
FIG. 2A is a bottom-plan view of a bondhead.
Figures 2B, 2C:
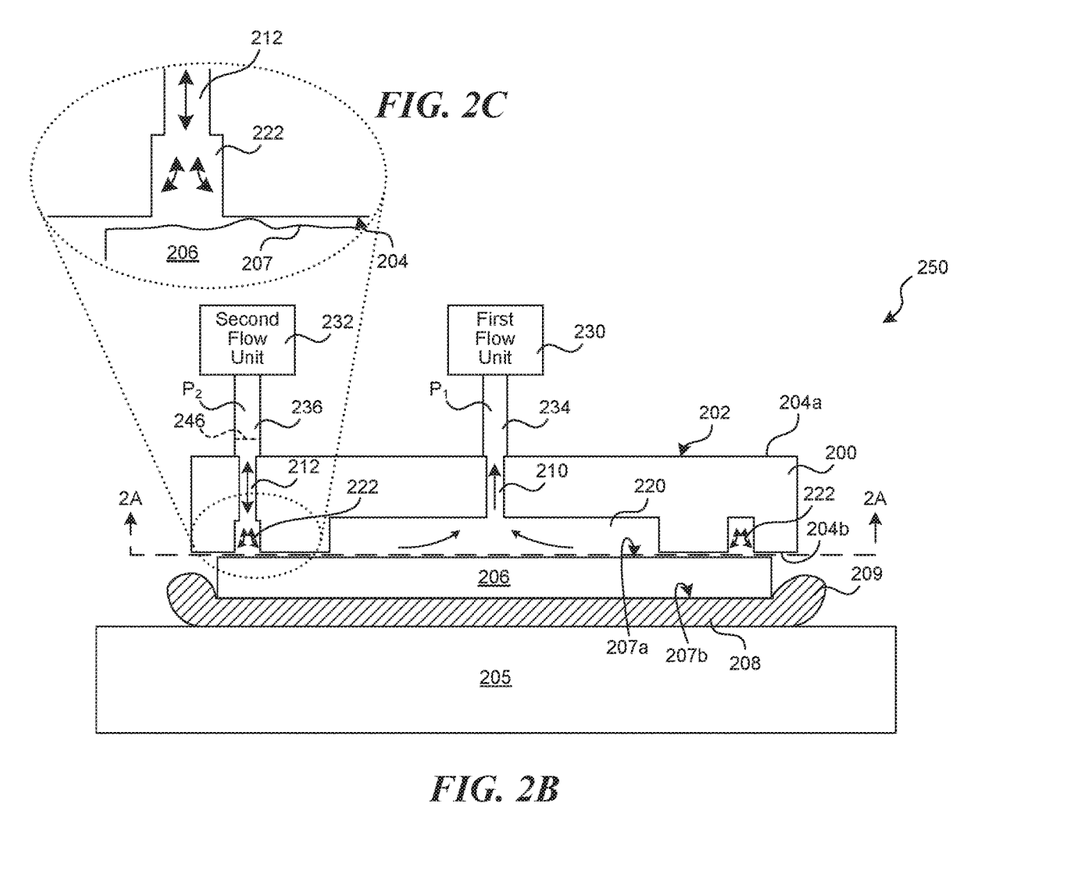
FIG. 2B is a cross-sectional side view of a semiconductor processing tool including the bondhead shown in FIG. 2A.
FIG. 2C is a magnified illustration of a portion of the processing tool shown in FIG. 2B, configured in accordance with selected embodiments of the present technology.

FIG. 2A is a bottom-plan view of a bondhead 200, and FIG. 2B is a cross-sectional side view of a semiconductor processing tool 250 ("tool 250") that implements the bondhead 200 in accordance with embodiments of the present technology. Referring first to FIG. 2B, the tool 250 includes the bondhead 200 having a first side 204a, and a second side 204b opposite the first side 204a. The tool 250 includes a first flow unit 230 fluidly coupled to the bondhead 200 at the first side 204a via a first conduit 234, and a second flow unit 232 fluidly coupled to the bondhead 200 at the first side 204a via a second conduit 236. The bondhead 200 is operably positioned over a semiconductor die 206 ("die 206") having a front side 207a and a back side 207b opposite the front side 207a. In operation, the front side 207a of the die 206 is in contact with the second side 204b of the bondhead 200, and the back side 207b of the die 206 is bonded to a substrate 205 with a bonding material 208 (e.g., a non-conductive film (NCF), a non-conductive paste (NCP), or a wafer level underfill (WLUF) material). A person of ordinary skill in the art will understand that in other embodiments, the bondhead 200 can similarly be brought in contact with the back side 207b of the die 206 instead of the front side 207a.

Referring to FIGS. 2A and 2B together, the bondhead 200 includes a first port 210 and a first channel 220 fluidly coupled to the first port 210. The first port 210 extends from the first side 204a of the bondhead 200 to a first intermediate depth of the bondhead. The first channel 220 extends from the second side 204b of the bondhead 200 to the first intermediate depth to meet the first port 210. The first port 210 and the first channel 220 together comprise a first opening extending through the bondhead 200, and the first opening is fluidly coupled to the first flow unit 230 via the first conduit 234. In some embodiments, the first opening is generally positioned over a center portion of the die 206. The first flow unit 230 is configured to draw a vacuum between the bondhead 200 and the die 206 positioned thereunder by withdrawing a first fluid (e.g., air) at a first pressure ($P_1$) through the first channel 220 and the first port 210. The first pressure ($P_1$) can be less than about 0.1 mega pascals (MPa). In other embodiments, the first pressure ($P_1$) can be from about 0.1 MPa and about 3 Pa.

The bondhead 200 further includes a second port 212 and a second channel 222 fluidly coupled to the second port 212. The second port 212 extends from the first side 204a of the bondhead 200 to a second intermediate depth, and the second channel 222 extends from the second side 204b of the bondhead 200 to the second intermediate depth to meet the second port 212. The first or second intermediate depths can be the same or different. The second port 212 and the second channel 222 together comprise a second opening extending through the bondhead 200. The second channel 222 surrounds and is peripheral to the first channel 220 such that the second channel 222 is positioned outwardly from the first channel 220. The second port 212 can be peripheral to the first port 210. The second opening is fluidly coupled to the second flow unit 232 and is generally positioned over a peripheral portion of the die 206. The second flow unit 232 is configured to provide a second fluid (e.g., air or nitrogen) to or withdraw the second fluid from the second channel 222 and second port 220 at a pressure ($P_2$). The second pressure ($P_2$) can be less than about 0.1 MPa. In other embodiments, the second pressure ($P_2$) can be from about 0.1 MPa and about 3 Pa. In some embodiments, the magnitude of the second pressure ($P_2$) is not greater than the magnitude of the first pressure ($P_1$). Stated otherwise, an absolute value of the second pressure ($P_2$) is not greater than an absolute value of the first pressure ($P_1$). Having a second pressure ($P_2$) with a magnitude less than the magnitude of the first pressure ($P_1$) helps ensure that the vacuum formed between the bondhead 200 and the die 206 via the first flow unit 230 is maintained even after the second flow unit 232 is turned on and/or fluidly coupled to the bondhead 200.

FIG. 2C is a magnified illustration of a portion of the tool 250 shown in FIG. 2B. As mentioned above in the Background section, the uneven topography of surfaces of semiconductor devices can allow vaporized bonding material (e.g., outgassed bonding material) to travel through gaps between the bondhead and the surfaces of the semiconductor device. The vaporized bonding material can eventually condense in the vacuum lines and/or vacuum hardware. One feature of the present technology is the ability to mitigate or inhibit the vaporized bonding material from entering the vacuum lines. As previously described, the second flow unit 232 is configured to provide the second fluid to or withdraw the second fluid from the second channel 222 and the second port 212, which are respectively positioned peripheral to the first channel 220 and the first port 210. In such an arrangement, the second fluid at least partially prevents any vaporized bonding material from entering the first opening. For example, in one embodiment wherein the second fluid is provided to the second channel 222, a positive pressure barrier is created peripheral to the first channel 220 that prevents at least a portion of any vaporized bonding material from reaching the first conduit 234 and/or first flow unit 230. This example is also beneficiary because the positive pressure barrier inhibits vaporized bonding material from entering the second port 212 as well. In another embodiment, wherein the second fluid is withdrawn from the second channel 222, a negative pressure is created peripheral to the first channel 220 that creates a path of least resistance for the vaporized bonding material to be withdrawn. In such an embodiment, at least a portion of any vaporized bonding material is preferentially withdrawn through the second channel 222 and the second port 212 instead of through the first channel 220 and the first port 210. In some embodiments, the second conduit 236 can have one or more filter units 246 (e.g., a mesh screen) configured to capture the vaporized bonding material 208, and thereby prevent any captured vaporized bonding material from fouling the second conduit 236 and/or the second flow unit 232.

Referring to FIG. 2A, the first channel 220 of the bondhead 200 includes a central portion 221a and outer portions 221b. The central portion 221a spans axially in a generally horizontal direction across a surface at the second side 204b of the bondhead 200, and includes the first port 210. The outer portions 221b span axially in a generally vertical direction across a surface at the second side 204b of the bondhead in the illustrated orientation. A purpose of the first channel 220 is to cover a sufficient surface area of the second side 204b of the bondhead 200 to ensure the air withdrawn through the first channel 220 and first port 210 provides sufficient suction force to hold the die 206 to the bondhead 200. The bondhead 200 is meant to represent a non-limiting example of possible bondhead designs that can be configured in accordance with the present technology.

Figure 3A:
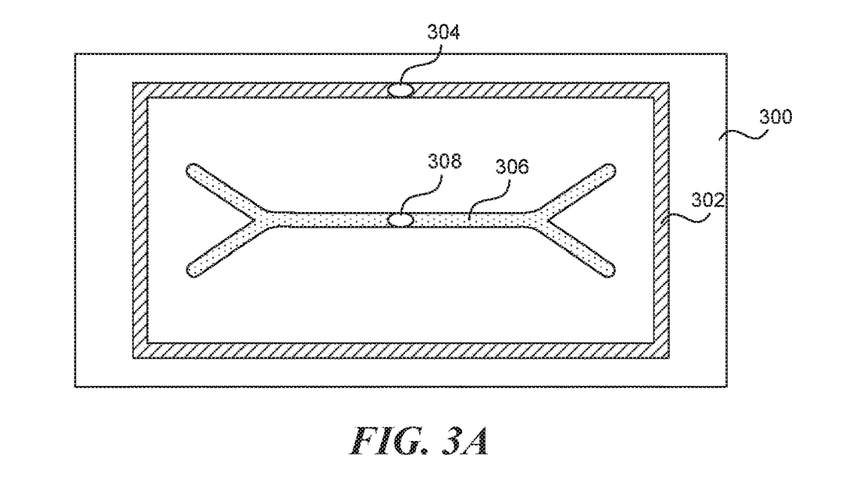
FIGS. 3A-3C are bottom-plan views of alternate bondhead designs configured in accordance with selected embodiments of the present technology.
Figure 3B:
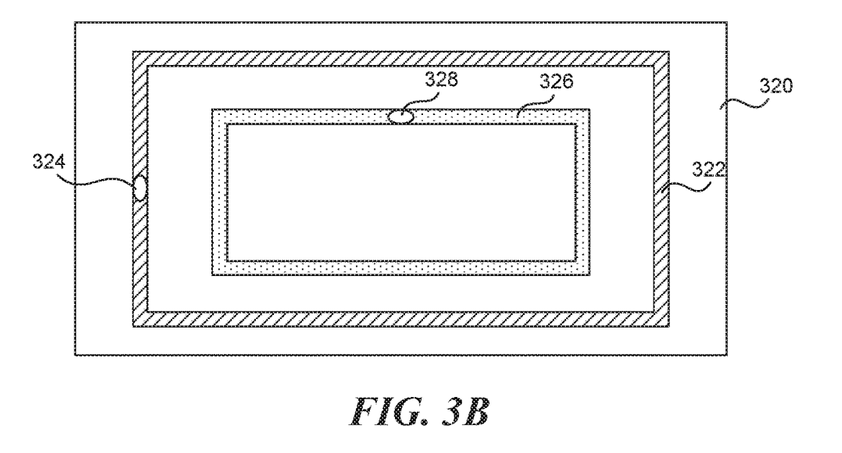
Figure 3C:
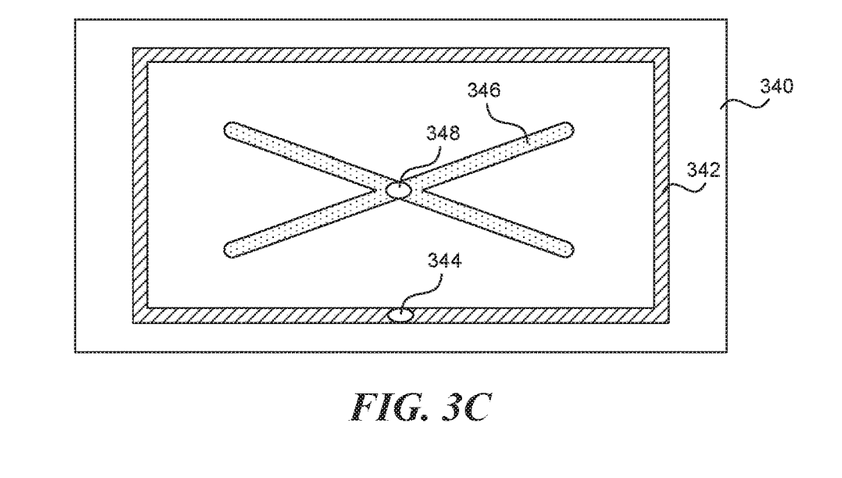

FIGS. 3A-3C, for example, illustrate bottom-plan views of alternate bondheads 300, 320, 340 that have different designs and achieve similar functionality to that of bondhead 200. Each bondhead 300, 320, 340 includes (i) a first port 308, 328, 348, (ii) a first channel 306, 326, 346, (iii) a second port 304, 324, 344, and (iv) a second channel 302, 322, 342. The first channels 306, 326 and 346 are all different than each other and the first channel 220 (FIG. 2A). A person of ordinary skill in the art will appreciate that further bondhead designs may be included and configured in accordance with the present technology.

A person of ordinary skill will recognize that the combination of the first port 210, the first channel 220, the second port 212 and the second channel 222 can be incorporated into a variety of systems. Accordingly, each of the first port 210, the bondhead 200 and each of the first channel 220, the second port 212, and the second channel 222 can include features and configurations in addition to or in lieu of those illustrated in FIGS. 2A and 2B. For example, the embodiment shown in FIG. 2A includes the first channel 220 having larger lateral dimensions than that of the first port 210. This larger lateral dimension can cover a larger surface area of the die 206 to help better secure the die 206 to the bondhead 200 once a vacuum is drawn via the first flow unit. In other embodiments, the lateral dimension of the first channel 220 may be smaller and/or the same size as that of the first port 210. Similarly, the first opening may be formed with only a first port, with the first channel being omitted. For example, the first port can extend through the bondhead 200 instead of extending only partially through the bondhead 200. Configurations of the second port 212 and the second channel 222 can vary in similar ways from the embodiment shown in FIG. 2A. As another example, the embodiment shown in FIG. 2A includes only a single port to flow the second fluid to or from the second channel. In other embodiments, additional ports may be provided to better ensure an even distribution of the second fluid throughout the second channel 222. For example, an additional second port (not shown) fluidly coupled to the second channel 222 and the second flow unit 232 may be included at an opposite end of the bondhead 200. As yet another example, in the embodiment shown in FIG. 2A the second channel 222 completely surrounds the first channel 220. In other embodiments, the second channel 222 only partially surrounds the first channel 220. For example, the second channel 222 may only surround upper and lower portions of the first channel 220, or other areas where vaporized bonding material is more likely to enter the first channel 220.

Figure 4:
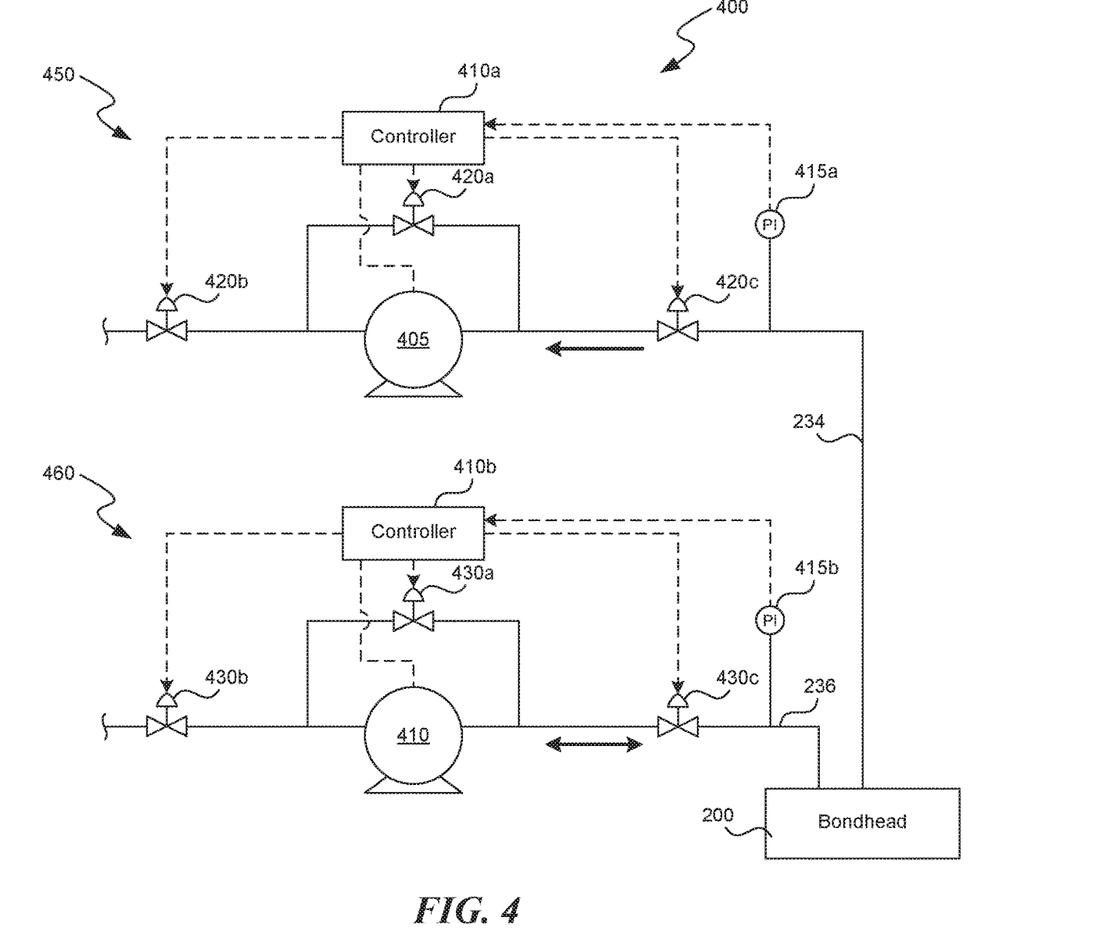
FIG. 4 is a schematic illustration of a flow unit system configured in accordance with selected embodiments of the present technology.

FIG. 4 is a schematic illustration of flow unit system 400 for withdrawing fluids from and/or providing fluids to the bondhead 200. The flow unit system 400 includes a first flow unit 450 configured to withdraw fluid from the bondhead 200, and a second flow unit 460 configured to flow fluid to and/or from the bondhead 200. The first and second flow units 450, 460 can include many of the same features of the respective first and second flow units 230, 232 described with respect to FIGS. 2A-2C. The first flow unit 450 includes a vacuum unit 405, a first recirculation valve 420a, a first discharge valve 420b, a first inlet valve 420c, and a first pressure sensor 415a. The first flow unit 450 is coupled to the bondhead 200 via the first conduit 234. The vacuum unit 405, the valves 420a-c, and the pressure sensor 415a can each be operably connected to a controller 410a for controlling flow through the vacuum unit 405 to maintain a particular pressure (e.g., $P_1$). For example, the controller 410a can maintain a particular pressure by opening and/or closing valves 420a-c according to the present value of the first pressure sensor 415a.

The second flow unit 460 includes a vacuum unit and/or blower unit 410, a second recirculation valve 430a, a second inlet valve 430b, a second discharge valve 430c (depending on direction of flow), and a second pressure sensor 415b. The second flow unit 460 is coupled to the bondhead 200 via the second conduit 236. The vacuum/blower unit 410, the valves 430a-c, and the second pressure sensor 415b can each be operably connected to a controller 410b for controlling flow through the vacuum/blower unit 410 to maintain a particular pressure (e.g., $P_2$). In some embodiments, the controllers 410a-c can be connected to a master controller (not shown) to provide better control pressure of the fluids being withdrawn from and/or directed to the bondhead 200. A person of ordinary skill in the art will recognize that other flow units and/or valve arrangements may be used to perform a similar function as described herein.

Figure 5A:
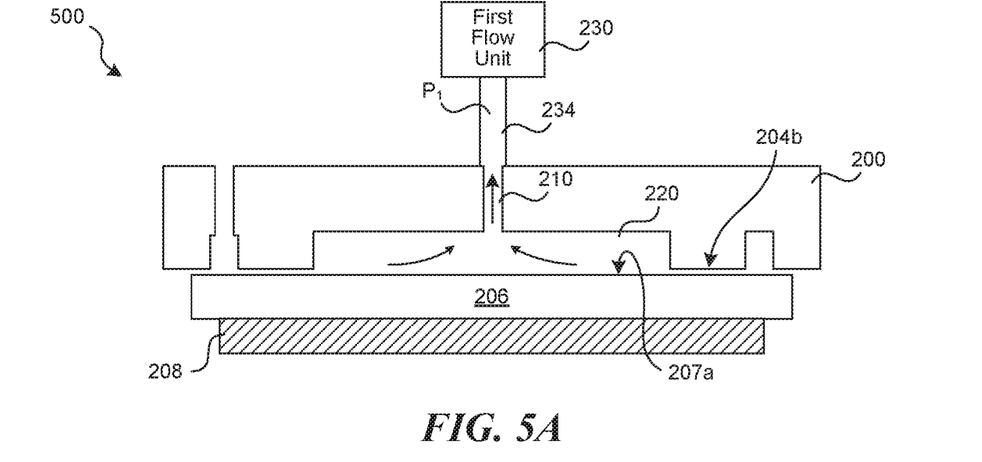
FIGS. 5A-5D are cross-sectional side views illustrating a method of using a semiconductor processing tool configured in accordance with selected embodiments of the present technology.

FIGS. 5A-5D are cross-sectional side views illustrating a method of using a semiconductor processing tool 500 ("tool 500"). Referring to FIG. 5A, the assembly 500 includes the bondhead 200 fluidly coupled to the first flow unit 230 via the first conduit 234. The first flow unit 230 withdraws air from the first opening (i.e., the first port 210 and the first channel 220) at a first pressure ($P_1$) to bring at least a portion of the die 206 into contact with at least a portion of the second side 204b of the bondhead 200. Once the die 206 is brought into contact with the bondhead 200, a seal may be formed at an interface between the die 206 and bondhead 200. Once established, the seal may be maintained even after the first flow unit (i.e., the vacuum unit) is turned off. As such, the first flow unit 230 does not need to be operable during the entire time the die 206 is being bonded to the substrate 205. Turning the first flow unit 230 off during the bonding process decreases the driving force that draws vaporized bonding material through the first opening and into the first conduit 234 and/or first flow unit 230. The bonding material 208 can be applied at the wafer level and thus may be present on the die 206 at the bottom side 207b prior to the die 206 being picked up by the bondhead 200.

Figure 5B:
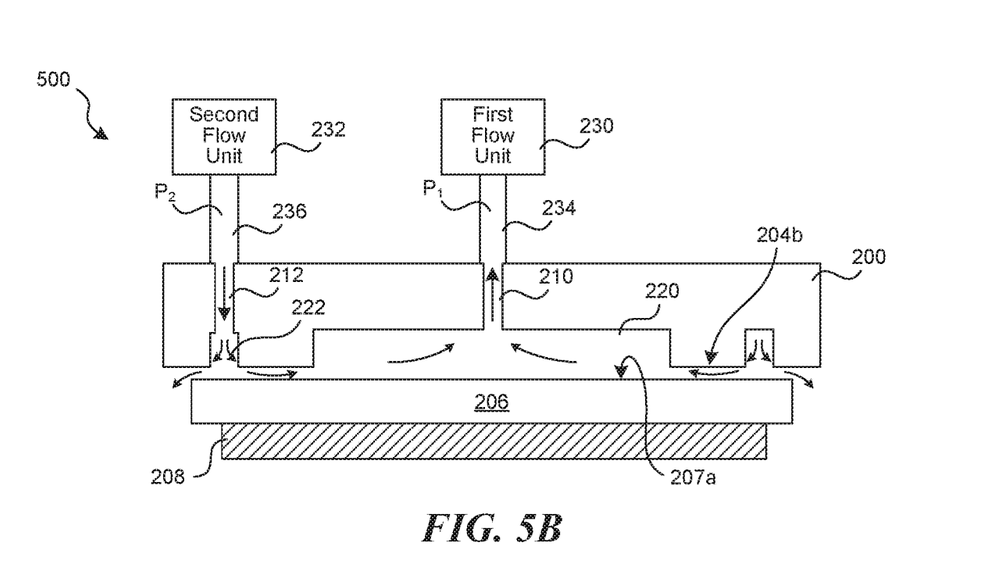

FIG. 5B shows the tool 500 after the second flow unit has been fluidly coupled to the bondhead 200 via the second conduit 236 and turned on. The second flow unit 232 directs the second fluid to the second opening (i.e., the second port 212 and the second channel 222) at the second pressure ($P_2$). Because the second opening is peripheral to and completely surrounds the first opening, the second fluid is directed towards outer portions of the die 206 compared to the first fluid being withdrawn through the first opening. As such, in operation the second fluid provides a fluidic barrier around the first opening that inhibits vaporized material from traveling between the second side 204b of the bondhead 200 and the front side 207a of the die 206.

Figure 5C:
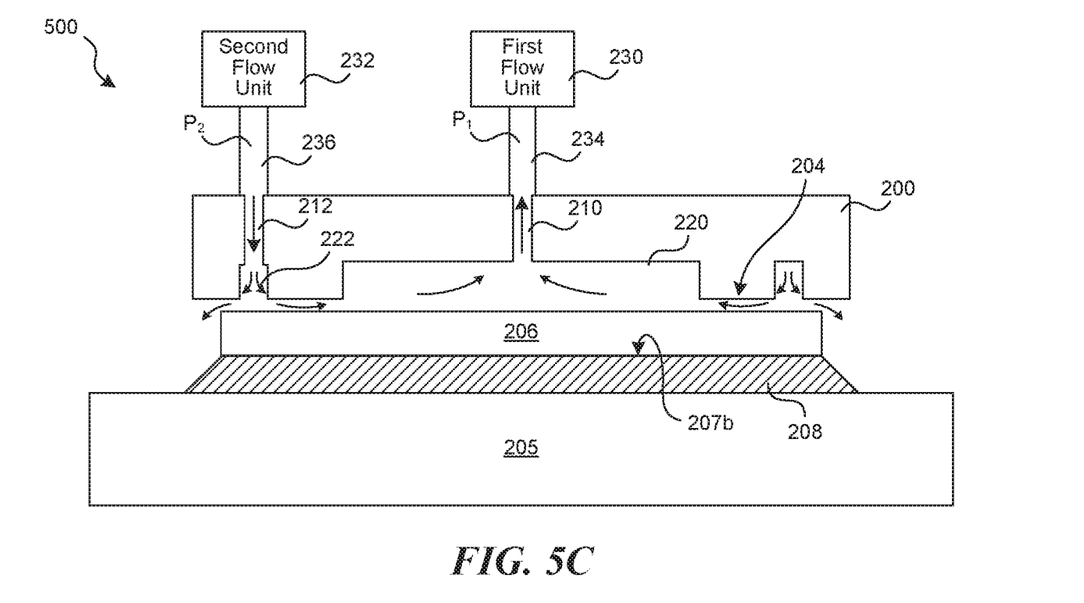
Figure 5D:
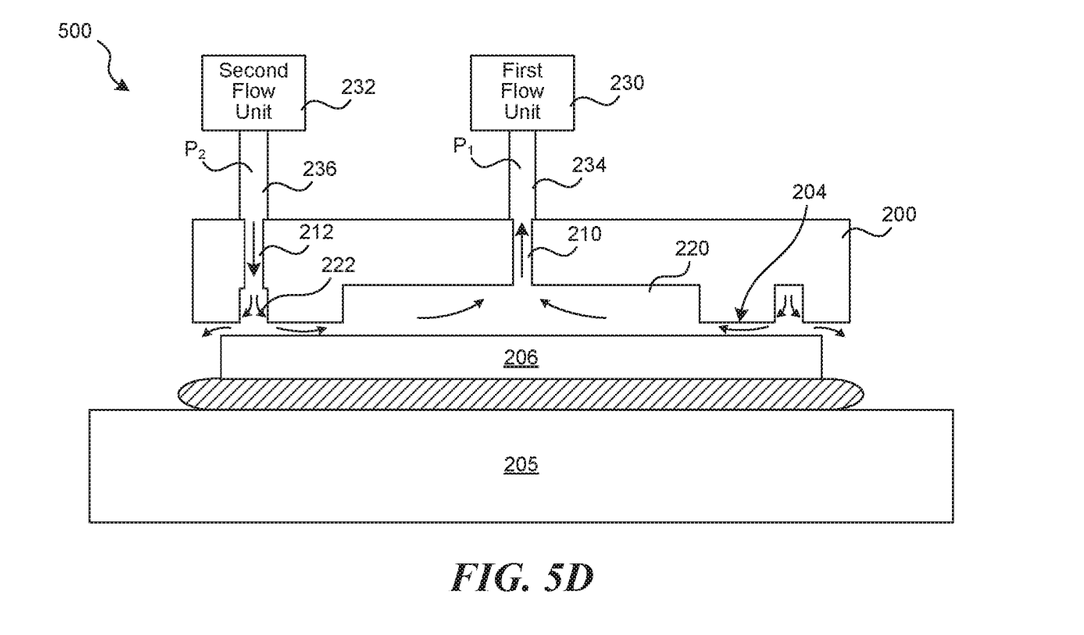

FIG. 5C shows the tool 500 after the die 206 is moved over the substrate 205 and the bonding material 208 previously laminated on the back side 207b of the die 206 contacts the substrate 205. The bonding process can occur at temperatures around 220° C., or temperatures high enough to form interconnects (e.g., solder interconnects), though outgassing of the bonding material 208 can begin at lower temperatures. As the bonding material 208 spreads to the periphery of the bottom side 207b of the die 206, the first flow unit 230 and the second flow unit 232 remain operational. As such, the second flow unit 232 continues to direct the second fluid toward outer portions of the die 206 and provide a fluidic barrier around the die 206 that inhibits bonding material 208 from traveling between the second side 204b of the bondhead 200 and the front side 207a of the die 206. The fluidic barrier of the second fluid also provides a driving force that directs vaporized bonding material away from the second channel 222 and the outer portion of the front side 207a of the die 206. As shown in FIG. 5D, which illustrates the tool 500 after the bonding material 208 has been laminated but before the bonding material 208 has fully cured, the driving force provided by the second fluid inhibits vaporized bonding material from reaching the first opening. Additionally, the driving force provided by the second fluid through the second opening inhibits fillets of bonding material 208 from forming at outer portions of the die 206.

Figure 6:
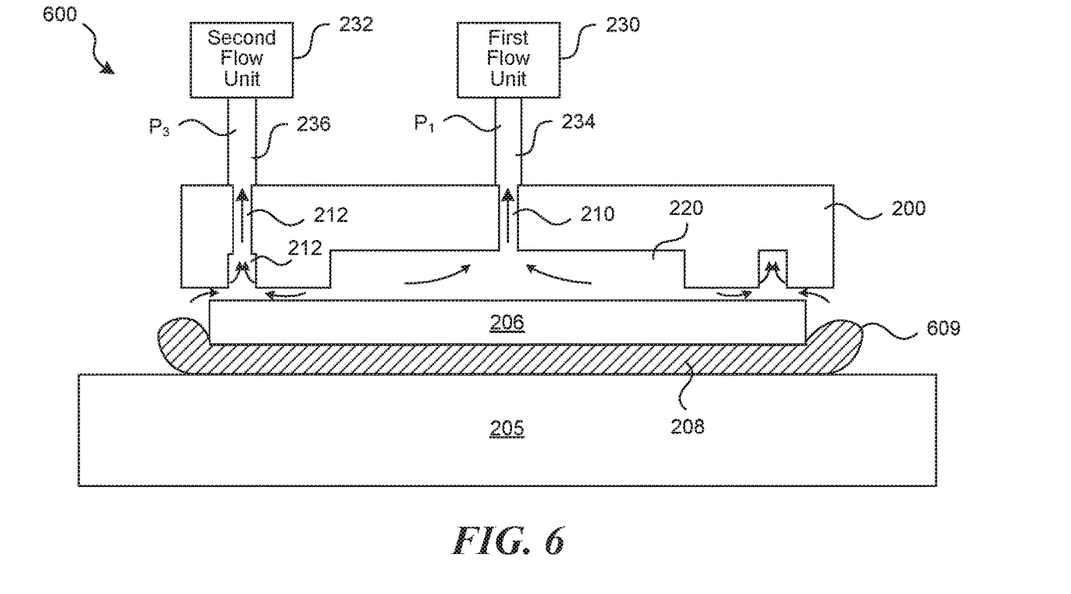
FIG. 6 is a cross-sectional side view of a semiconductor processing tool configured in accordance with selected embodiments of the present technology.

FIG. 6 is a cross-sectional side view of a semiconductor processing tool 600 ("the tool 600") configured in accordance with selected embodiments of the present technology.

The tool 600 includes features generally similar to those of the assemblies described in detail above. In the illustrated embodiment of FIG. 6, the second flow unit 232 withdraws the second fluid from the second channel 222 and the second port 212 at a third pressure ($P_3$). The third pressure ($P_3$) can be less than about 0.1 MPa, or vary from about 0.1 MPa and about 3 Pa. Withdrawing the second fluid through the second opening withdraws any vaporized bonding material into the second port 212 to inhibit the vaporized bonding material from reaching the first opening. Withdrawing the second fluid from the second opening can also aid in forming a second seal between the bondhead 200 and the die 206 in addition to the seal formed by withdrawing the first fluid through the first opening. This second seal can further inhibit bonding material 208 from reaching the first opening.

Figure 7A:
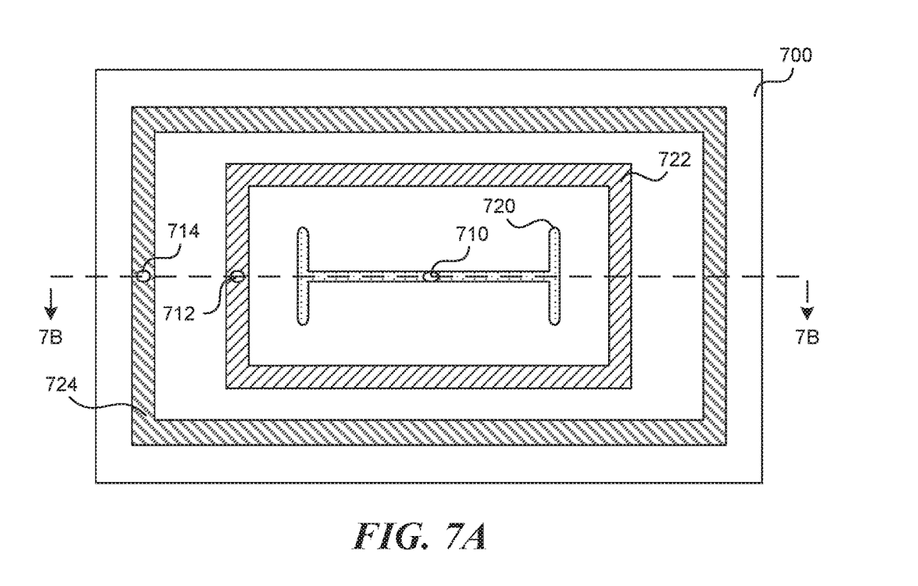
FIG. 7A is a bottom-plan view of a bondhead.
Figure 7B:
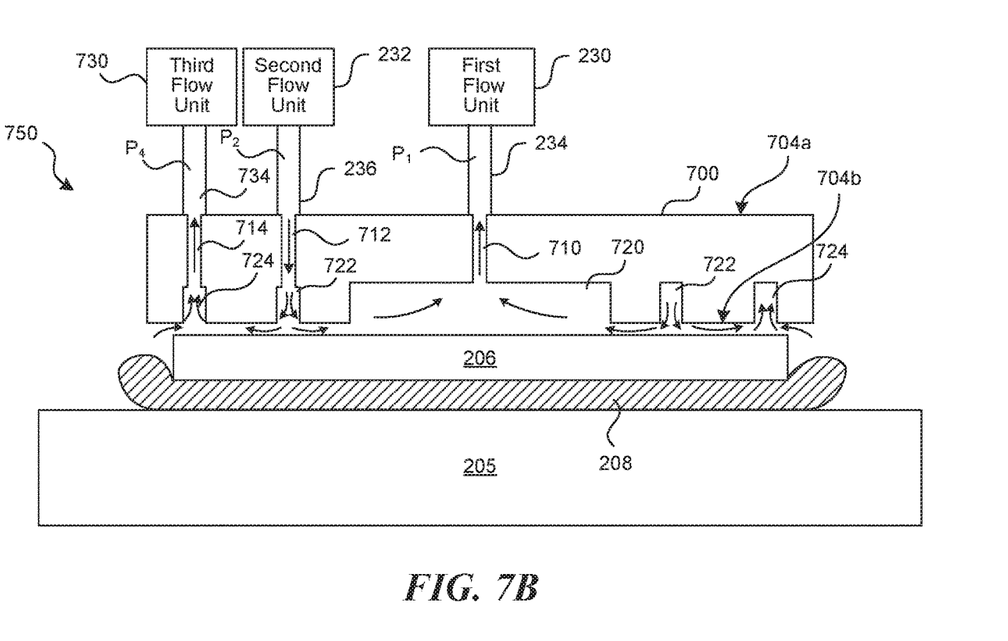
FIG. 7B is a cross-sectional side view of a semiconductor processing tool including the bondhead shown in FIG. 7A, configured in accordance with selected embodiments of the present technology.

FIG. 7A is a bottom-plan view of a bondhead 700, and FIG. 7B is a cross-sectional side view of a semiconductor processing tool 750 ("tool 750"). The tool 750 can include features generally similar to those of the tools described in detail above. For example, the tool 750 includes a bondhead 700 having a first port 710 and a first channel 720 that together comprise a first opening extending through the bondhead 700. The tool 750 further includes a second port 712 and a second channel 722 that together comprise a second opening extending through the bondhead 700. The first opening is fluidly coupled to the first flow unit 230 via the first conduit 234, and the second opening is fluidly coupled to the second flow unit 232 via the second conduit 236. In the illustrated embodiment of FIG. 7B, the bondhead 700 further includes a third port 714 and a third channel 724 fluidly coupled to the third port 714. The third port 714 extends from a first side 704a of the bondhead 700 to an intermediate depth of the bondhead 700 and the third channel 724 extends from a second side 704b of the bondhead 700 to meet the third port 714. The third port 714 and the third channel 724 together comprise a third opening extending through the bondhead 700. The third opening is peripheral to the first and second openings of the bondhead 700. The third opening is fluidly coupled to a third flow unit 730 configured to withdraw a third fluid (e.g., air and/or nitrogen) at a fourth pressure ($P_4$) through the third opening. The fourth pressure ($P_4$) can be less than about 0.1 µPa, or vary from about 0.1 MPa and about 3 Pa. In operation, the third opening can further inhibit vaporized bonding material 208 from entering the first opening, and thus the first conduit 234 and the first flow unit 230.

A person of ordinary skill will recognize that in other embodiments, the tool 750 can be configured differently. For example, the second flow unit 232 may be configured to withdraw the second fluid from the second port 212 and the second channel 222. Similarly, the third flow unit 730 may be configured to provide the third fluid to the third port 712 and the third channel 722. A person of ordinary skill in the art will appreciate that any combination of these different configurations can be incorporated into the present technology.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. For example, while the specification focuses on NCF, NCP, and/or WLUF, the present technology can also be applied to other processes and/or applications, such as fluxes used for microbump formation, thermocompression bonding (TCB), and flip-chips. In some cases, well known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:
1. A semiconductor processing tool comprising:
a bondhead having a first port, a second port, a third port
a first channel fluidly coupled to the first port, a second channel fluidly coupled to the second port, and a third channel fluidly coupled to the third port,
wherein the first port the second port, and the third port are coplanar, and
wherein the second and third channels at least partially surrounds the first channel;
a first flow unit coupled to the first port and configured to withdraw air from the first channel;
a second flow unit coupled to the second port and configured to withdraw a fluid from or provide the fluid to the second channel; and
a third flow unit coupled to the third port and configured to provide a second fluid to or withdraw the second fluid from the third channel.
2. The tool of claim 1 wherein—
the first flow unit includes a vacuum unit that creates a first pressure in the first channel,
the second flow unit includes a blower unit that creates a second pressure in the second channel, and
the second pressure is higher than the first pressure.
3. The tool of claim 2 wherein an absolute value of the first pressure is greater than an absolute value of the second pressure.

4. The tool of claim 1 wherein:
the third channel at least partially surrounds the second channel; and
the third port is coplanar with the first and second ports along a laterally-oriented plane.

5. The tool of claim 4 wherein the second flow unit is configured to provide the first fluid to the second channel and the third flow unit is configured to withdraw the second fluid from the third channel.

6. The tool of claim 1 wherein the bondhead is configured to be positioned over a die and a bonding material, and wherein the fluid provided to or withdrawn from the second port at least partially prevents vaporized bonding material from entering the first channel.

7. The tool of claim 1 wherein the first port and the first channel comprise a first opening through the bondhead, and wherein the second port and the second channel together comprise a second opening through the bondhead and completely surrounding the first opening.

8. The tool of claim 1 wherein the bondhead includes a first side and a second side opposite the first side, wherein the first and second ports extend from the first side of the bondhead and at least partially through the bondhead, and wherein the first and second channels extend from the second side of the bondhead and at least partially through the bondhead.

9. The tool of claim 8 wherein the first and second ports and first and second channels each extend through the bondhead to a common depth.

10. The tool of claim 1 wherein the fluid is air and/or nitrogen.

11. A semiconductor processing apparatus comprising:
a bondhead including a first side, a second side opposite the first side, a first opening, a second opening, and a third opening wherein the second and third openings are peripheral to the first opening, wherein the first, second, and third openings each extend from the first side of the bondhead to the second side of the bondhead,
wherein—
the first opening is configured to be coupled to a first flow unit that withdraws a first fluid from the first opening;
the second opening is configured to be coupled to a second flow unit that provides a second fluid to or withdraws the second fluid from the second opening; and
the third opening is coplanar with the first and second openings and is configured to be coupled to a third flow unit that provides a third fluid to or withdraws the third fluid from the third opening.

12. The apparatus of claim 11 wherein the first opening includes a first port and a first channel, and the second opening includes a second port and a second channel.

13. The apparatus of claim 12 wherein the first flow unit includes a vacuum unit and a first conduit coupling the vacuum unit to the first port, and wherein the second flow unit includes a blower unit and a second conduit coupling the blower unit to the second port.

14. The apparatus of claim 11 wherein the first flow unit creates a first pressure in the first opening and the second flow unit creates a second pressure in the second opening, and wherein an absolute value of the first pressure is greater than an absolute value of the second pressure.

15. The apparatus of claim 11, wherein the third opening is peripheral to and at least partially surrounds the second opening, wherein the third opening is coplanar with the first and second openings along a laterally-oriented plane.

16. The apparatus of claim 15 wherein the second flow unit is configured to provide the second fluid to the second opening and the third flow unit is configured to withdraw the third fluid from the third opening.

17. The apparatus of claim 11 wherein the bondhead is configured to be positioned over a die and bonding material, and wherein the second fluid provided to or withdrawn from the second opening at least partially prevents vaporized bonding material from entering the first opening.

18. A method for inhibiting vaporized bonding material from entering a vacuum system, the method comprising:
withdrawing air, via a first flow unit, from a first port of a bondhead, wherein the first port is fluidly coupled to a first channel of the bondhead;
flowing a fluid, via a second flow unit, through a second port of the bondhead, wherein:
the second port is fluidly coupled to a second channel of the bondhead, and
the second channel at least substantially surrounds the first channel; and
flowing a second fluid, via a third flow unit, through a third port of the bondhead, wherein the third port is coplanar with the first and second ports.

19. The method of claim 18 wherein flowing a fluid includes flowing the fluid toward the bondhead via the second port.

20. The method of claim 19 wherein withdrawing air includes withdrawing pressurized air at a first pressure, and wherein flowing a fluid includes flowing a pressurized fluid at a second pressure greater than the first pressure.

21. The method of claim 18, further comprising:
positioning the bondhead at least substantially over a die at least partially surrounded by a bonding material, and
wherein flowing a fluid includes preventing at least a portion of the bonding material from flowing through the first port.

22. The method of claim 18 wherein the third port is coplanar with the first and second ports along a laterally-oriented plane.

23. The method of claim 22 wherein flowing a second fluid includes flowing the first fluid toward the bondhead via the second port, and wherein flowing a second fluid includes flowing the second fluid away from the bondhead via the third port.

24. A method of manufacturing a semiconductor processing apparatus, the method comprising:
forming a bondhead having a first port, a second port and a third port peripheral to the first port, a first channel fluidly coupled to the first port, and a second channel fluidly coupled to the second port,
wherein the second channel at least partially surrounds the first channel, and
wherein the first, second, and third ports are coplanar;
coupling a first flow unit to the first port;
coupling a second flow unit to the second port; and
coupling a third flow unit to the third port, wherein the third port is configured to provide a second fluid to or withdraw the second fluid from the third port.

25. The method of claim 24 wherein—
the bondhead includes a first side and a second side opposite the first side, the first and second ports extend from the first side of the bondhead to an intermediate depth of the bondhead, and the first and second channels extend from the second side of the bondhead to the intermediate depth of the bondhead.

\* \* \* \* \*